United States Patent
Chang et al.

(10) Patent No.: US 6,180,471 B1
(45) Date of Patent: Jan. 30, 2001

(54) METHOD OF FABRICATING HIGH VOLTAGE SEMICONDUCTOR DEVICE

(75) Inventors: Peter Chang; Gary Hong; Joe Ko, all of Hsinchu (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/183,062

(22) Filed: Oct. 30, 1998

(30) Foreign Application Priority Data

Aug. 20, 1998 (TW) .................................................. 87113699

(51) Int. Cl.⁷ ........................ H01L 21/336; H01L 21/425
(52) U.S. Cl. ........................ 438/302; 438/305; 438/525; 438/529
(58) Field of Search .................................... 438/302, 305, 438/525, 529

(56) References Cited

U.S. PATENT DOCUMENTS

| | | | |
|---|---|---|---|
| 5,376,566 | * 12/1994 | Gonzalez . | |
| 5,518,941 | * 5/1996 | Lin et al. . | |
| 5,753,556 | * 5/1998 | Katada et al. | 438/302 |
| 5,770,502 | * 6/1998 | Lee | 438/264 |
| 5,834,347 | * 11/1998 | Fukatsu et al. | 438/232 |
| 5,966,604 | * 10/1999 | Lin et al. | 438/279 |
| 6,020,228 | * 2/2000 | Asakura | 438/199 |

\* cited by examiner

*Primary Examiner*—Richard Booth
(74) *Attorney, Agent, or Firm*—Thomas, Kayden, Horstemeyer & Risley

(57) ABSTRACT

A method of fabricating a high voltage semiconductor device. A semiconductor substrate doped with a first type dopant and comprising a gate is provided. A cap oxide layer is formed on the gate optionally. A first ion implantation with a light second type dopant at a wide angle is performed to form a lightly doped region. A spacer is formed on a side wall of the gate. A second ion implantation with a heavy second type dopant is performed, so that a heavily doped region is formed within the lightly doped region.

12 Claims, 4 Drawing Sheets

METHOD OF FABRICATING HIGH VOLTAGE SEMICONDUCTOR DEVICE

CROSS-REFERENCE TO RELATED APPLICATION

This application claims priority benefit of Taiwan application Ser. No. 87113699, filed Aug. 20, 1998, the full disclosure of which is incorporated herein by reference.

BACKGROUND OF THE INVENTION

1. Field of the Invention

The invention relates to a method of fabricating a high voltage semiconductor, and more particularly to a method of fabricating a lightly doped drain (LDD) in a semiconductor device.

2. Description of the Related Art

The modern integrated circuit techniques is developed towards the direction of narrower line width and shorter channel length of a metal oxide semiconductor (MOS). By applying a constant voltage, the lateral electric field in the channel is increased as reducing the channel length. Thus, the electron in the channel is accelerated, and the energy of the electron is increased, especially in the vicinity between the channel and the source/drain region. The energy of the electron is higher than the energy of an electron under thermal equilibrium. Some of the electron in the channel tunnels through the oxide layer. Therefore, the produced hole flows into the substrate, and a leakage current occurs.

To reduce the hot electron effect, a lightly doping process is performed at the vicinity between the source/drain region and the channel before the formation of a heavily doped source/drain region. An LDD structure is formed, and the leakage current is prevented.

Referring to FIG. 1A to FIG. 1E, cross sectional views of an LDD structure in a MOS is shown.

Referring to FIG. 1A, on a P-type semiconductor substrate 1, an oxide layer 2 is formed. On the oxide layer, a conductive layer 2 is formed. After patterning, a gate 4 is formed. The formation of the oxide layer 2 is to moderate the scattering of subsequent implanted ions due to collision with the silicon atoms of the substrate in an amorphous form. The diffusion of ions into the P-type semiconductor substrate is thus avoided.

Referring to FIG. 1B, N⁻ ions are implanted with an angle of about 0° to 7° towards the semiconductor substrate 1 to form a lightly doped region 6 and 8. The implantation ions are, for example, phosphorous ions ($P^{31}$) having a concentration of $1 \times 10^{13}/cm^2$ to $1 \times 10^{14}/cm^2$ with an energy between 30 KeV to 100 KeV. The resultant implantation depth is about 0.02 μm to 0.15 μm.

Referring to FIG. 1C, using thermal drive-in, the implantation depth of the lightly doped region 6 and 8 is extended from to 0.25 μm to 0.6 μm as a lightly doped region 6a and 8a. The thermal drive-in is performed at about 850° C. to 1050° C.

Referring to FIG. 1D, a silicon oxide layer is formed and defined to form a spacer 10 on s side wall of the gate.

Referring to FIG. 1E, using the gate 2 and the spacer 10 as masks, ion implantation is performed with heavy N⁺ ions at an angle of about 0° to 7° to form a heavily doped region 6b and 8b. The implantation ions are, for example, phosphorous or arsenic ions with a concentration of about $1 \times 10^{14}/cm^2$ to $1 \times 10^{15}/cm^2$ at an energy about 100 KeV to 200 KeV.

In the convention method of fabricating a high voltage semiconductor, an LDD source/drain structure is formed after the formation of gate. A lightly ion implantation is performed to form a lightly doped region. By thermal drive-in, the implantation depth of the lightly doped region is extended. After the formation of a spacer, a heavy doped region is formed within the lightly doped region by ion implantation. Using the gate as a mask to perform ion implantation, the concentration of dopant within the gate is altered, and therefore, the characteristics of the device, such as the threshold voltage, are altered. Moreover, during the thermal drive-in process, a cross diffusion occurs between the gate and the lightly doped region. Thus, the device is degraded. The degradation is further obvious for the sub-micron process.

SUMMARY OF THE INVENTION

It is therefore an object of the invention to provide a method of fabricating a high voltage semiconductor device. An oxide layer is formed on the gate before ion implantation for forming a lightly doped region to protect the gate from being further doped and damaged. Therefore, the concentration of dopant within the gate is not altered. Moreover, ion implantation is performed with a wide angle. The thermal drive-in process is not necessary to performed. The cross diffusion of the dopant between the doped region within the substrate and gate is avoid. The reliability of the device is enhanced.

To achieve these objects and advantages, and in accordance with the purpose of the invention, as embodied and broadly described herein, the invention is directed towards a method of fabricating a high voltage semiconductor device. A semiconductor substrate doped with a first type dopant and comprising a gate is provided. A cap oxide layer is formed on the gate optionally. A first ion implantation with a light second type dopant at a wide angle is performed to form a lightly doped region. A spacer is formed on a side wall of the gate. A second ion implantation with a heavy second type dopant is performed, so that a heavily doped region is formed within the lightly doped region.

It is to be understood that both the foregoing general description and the following detailed description are exemplary and explanatory only and are not restrictive of the invention, as claimed.

DESCRIPTION OF THE PREFERRED EMBODIMENTS

In the invention, a cap oxide layer is formed on the gate before performing ion implantation for forming a lightly doped region. Thus, the gate is not further doped and damaged by the implanted ions. A lightly doped region is formed by a first ion implantation with a wide angle. Thus, the implanted ions can reach the region under the gate without performing thermal drive-in process. The cross diffusion during thermal drive-in is therefore prevented.

Figure 1A:
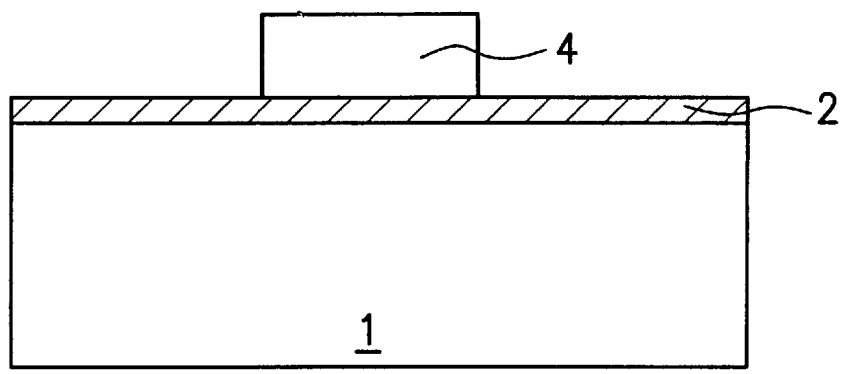
FIG. 1A to FIG. 1E are cross sectional views of the process for fabricating an LDD structure in a metal-oxide-semiconductor (MOS) formed by a conventional method.
Figure 1B:
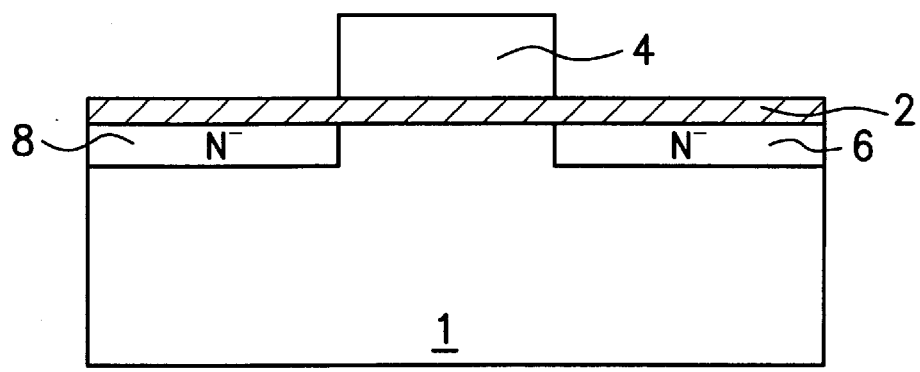
Figure 1C:
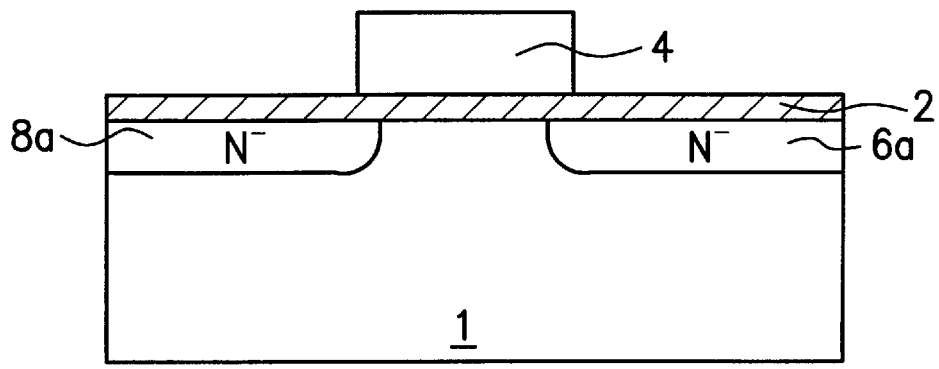
Figure 1D:
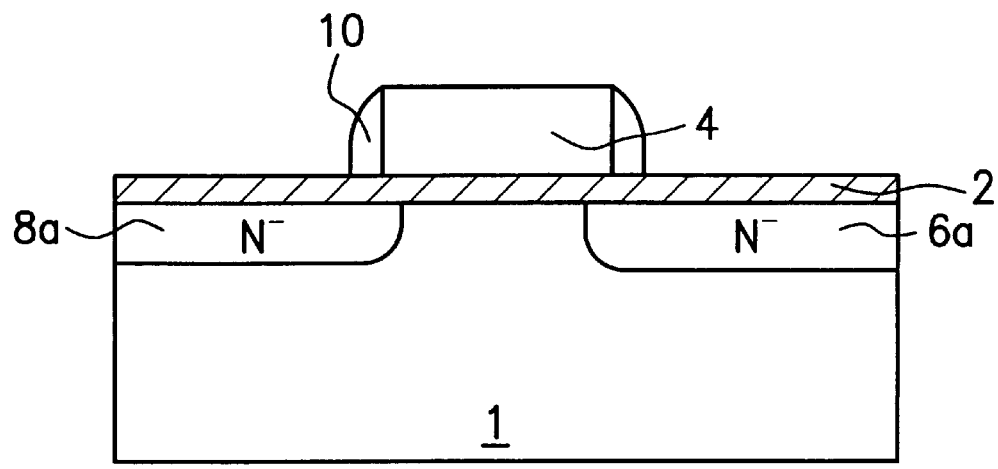
Figure 1E:
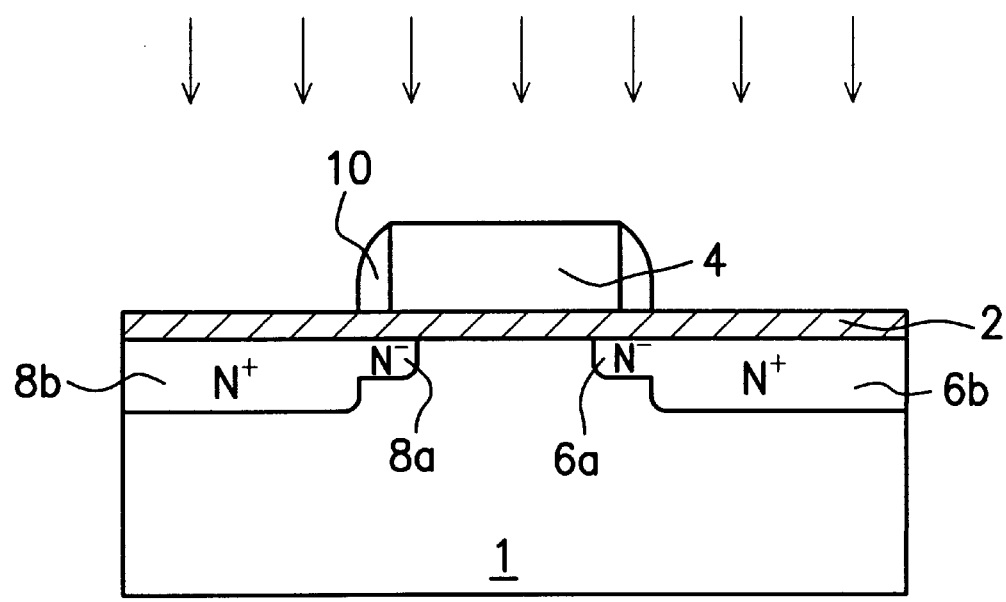
Figure 2A:
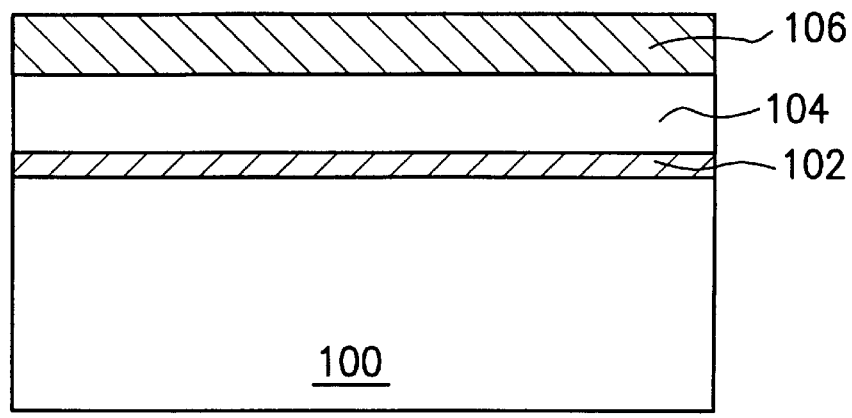
FIG. 2A to FIG. 2E are cross sectional views of the process for fabricating an LDD structure in a high voltage in a preferred embodiment according to the invention.

Referring to FIG. 2A, on a P-type semiconductor 100, a gate oxide layer 102 is formed, for example, by thermal oxidation. A conductive layer such as a poly-silicon layer 104 is formed on the gate oxide layer 102, for example, by chemical vapour deposition (CVD). An oxide layer 106 is formed on the conductive layer 104.

Figure 2B:
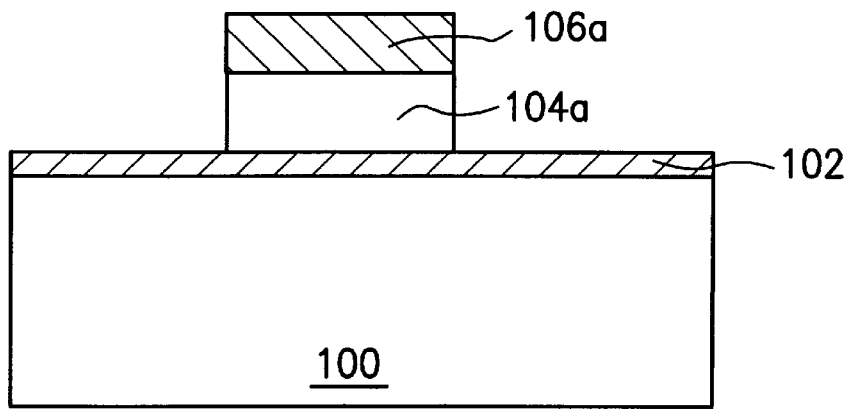

Referring FIG. 2B, the gate oxide layer 102, the conductive layer 104, and the oxide layer 106 are patterned to form a gate formed of the gate oxide layer 102a and the conductive layer 104a, with a cap oxide layer 106a.

Figure 2C:
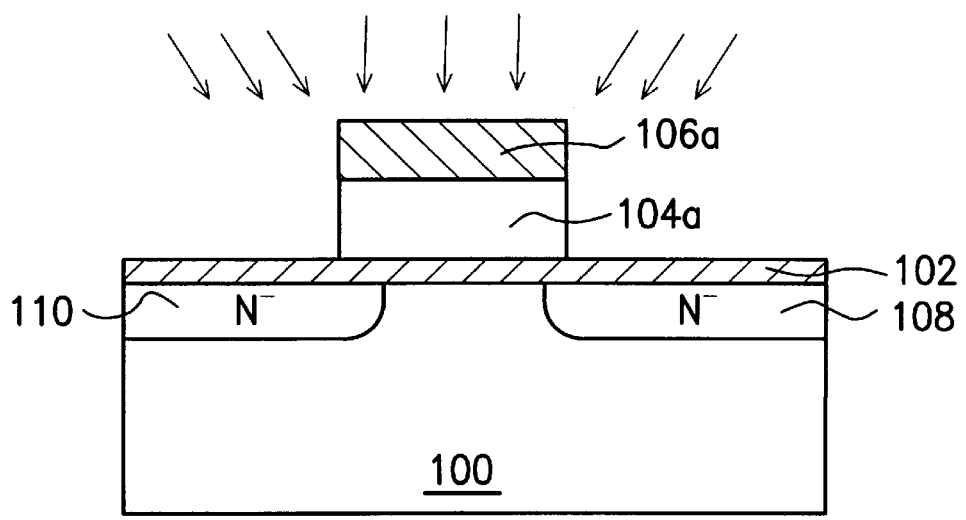

Referring to FIG. 2C, lightly doped regions 108, 110, that is, lightly dope source/drain regions, are formed by ion implantation with a wide angle, for example, 7° to 45°. The implanted ions, for example, phosphorous ions ($p^{31}$), have a concentration of about $1 \times 10^{13}/cm^2$ to $1 \times 10^{14}/cm^2$ with an energy about 150 KeV to 500 KeV. The ions reach the region under the gate by a wide angle implantation without further thermal drive-in process. Therefore, the cross diffusion of ions between the gate and the lightly doped region 108, 110 is prevented. In addition, the formation of the cap oxide layer 106a protects the gate from being damaged during ion implantation. Due to the very high energy, the implanted depth of the ions is about 0.2 μm to 0.6 μm.

Figure 2D:
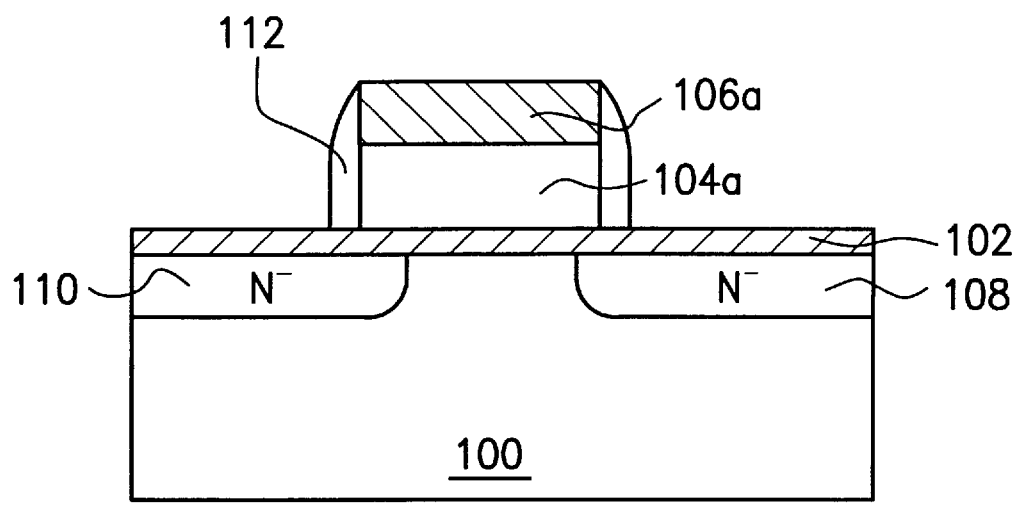

Referring to FIG. 2D, a silicon oxide layer is formed, for example, by CVD and patterned to form a spacer on a side wall 112 of the gate. In addition to isolate two lightly doped region 108 and 110, the formation of spacer is used as a mask for the subsequent heavily doping process to form a heavily dope region, that is, a heavily doped source/drain region.

Figure 2E:
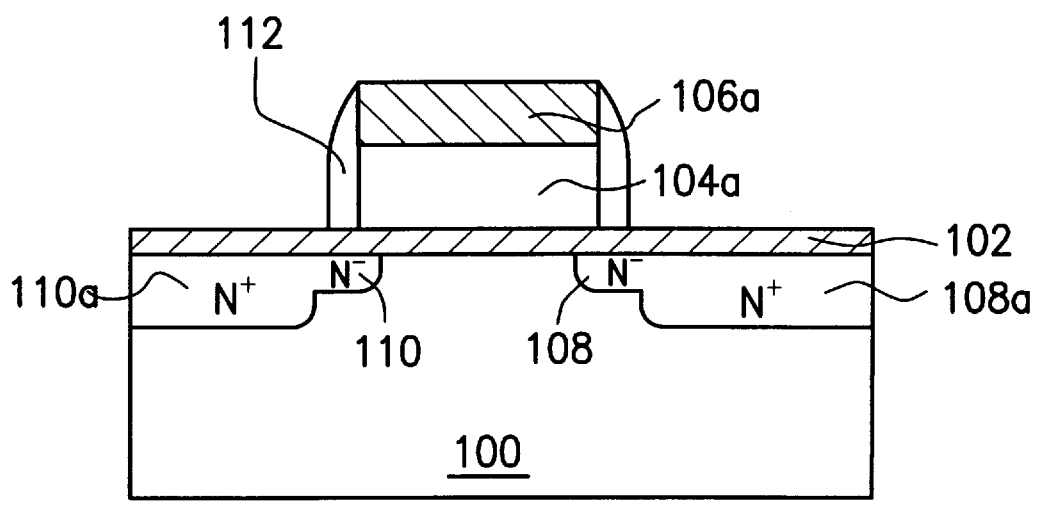

Referring to FIG. 2E, heavily doped regions 108a, 110a, that is, heavily dope source/drain regions, are formed within the lightly doped regions by ion implantation with an angle, for example, 0° to 7°. The implanted ions, for example, phosphorous ions ($P^{31}$) or arsenic ions, have a concentration of about $1 \times 10^{14}/cm^2$ to $1 \times 10^{15}/cm^2$ with an energy about 100 KeV to 200 KeV. An LDD structure is thus formed.

In the invention, a wide angle ion implantation is performed instead of a conventional ion implantation with a thermal drive-in. The cross diffusion of ions between the gate and the doped region caused by thermal drive-in process is prevented. In addition, the wide angle ion implantation is easily operated, that is, the doped region and the depth of implantation are easily control. The devices can be fabricated uniformly. Moreover, the formation of a cap oxide protects the gate from being damaged during ion implantation. The characteristics of the devices, for example, the threshold voltage is not degraded. The reliability of the device is hence enhanced.

With the above LDD structure, a high voltage semiconductor device is fabricated with a higher reliability and an improved characteristic.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a high voltage semiconductor device, wherein a semiconductor substrate doped with a first type dopant and comprising a gate is provided, comprising:
   performing a first ion implantation to form a lightly doped region, wherein the first ion implantation is performed with a sufficiently high energy and a second type dopant at a sufficiently wide angle so that no separate thermal drive-in is required, wherein the light second type dopant has a concentration of about $1 \times 10^{13}/cm^2$ to $1 \times 10^{13}/cm^2$ and an energy about 150 KeV to 500 KeV;
   forming a spacer on a sidewall of the gate; and
   performing a second ion implantation with a heavy second type dopant, so that a heavily doped region is formed within the lightly doped region.

2. The method according to claim 1, wherein the wide angle is within a range of about 7° to 45°.

3. The method according to claim 1, wherein the lightly doped region has a depth of about 0.2 μm to 0.6 μm.

4. The method according to claim 1, wherein the light second type dopant is phosphorous ions or arsenic ions.

5. The method according to claim 1, wherein the heavy second type dopant has a concentration of about $1 \times 10^{14}/cm^2$ to $1 \times 10^{15}/cm^2$ at an energy about 100 KeV to 200 KeV.

6. The method according to claim 1, wherein the second ion implantation is performed with an angle about 0° to 7°.

7. A method of fabricating a high voltage semiconductor device, wherein a semiconductor substrate doped with a first type dopant and comprising a gate oxide layer and a conductive laver is provided, comprising:
   forming an oxide layer on the conductive layer;
   patterning the oxide layer, the conductive layer, and the gate oxide layer to form a gate with a cap oxide;
   performing a first ion implantation to form a lightly doped region, wherein the first ion implantation is performed with a sufficiently high energy and a light second type dopant at a sufficiently wide angle so that no separate thermal drive-in is required, wherein the light second type dopant has a concentration of about $1 \times 10^{13}/cm^2$ to $1 \times 10^{13}/cm^2$ and an energy about 150 KeV to 500 KeV;
   forming a spacer on a sidewall of the gate; and
   performing a second ion implantation with a heavy second type dopant, so that a heavily doped region is formed within the lightly doped region.

8. The method according to claim 7, wherein the wide angle is within a range of about 7° to 45°.

9. The method according to claim 7, wherein the lightly doped region has a depth of about 0.2 μm to 0.6 μm.

10. The method according to claim 7, wherein the light second type dopant is phosphorous ions or arsenic ions.

11. The method according to claim 7, wherein the heavy second type dopant has a concentration of about $1 \times 10^{14}/cm^2$ to $1 \times 10^{15}/cm^2$ at an energy about 100 KeV to 200 KeV.

12. The method according to claim 10, wherein the second ion implantation is performed with an angle about 0° to 7°.

* * * * *